United States Patent [19]
Matsui

[11] Patent Number: 5,466,548
[45] Date of Patent: Nov. 14, 1995

[54] METHOD FOR PRODUCING NANOMETER ORDER DOT PATTERN BY ELECTRON HOLOGRAPHY AND DRAWING APPARATUS FOR THE SAME

[75] Inventor: Shinji Matsui, Tokyo, Japan

[73] Assignee: NEC Corporation, Tokyo, Japan

[21] Appl. No.: 281,980

[22] Filed: Jul. 29, 1994

[30] Foreign Application Priority Data

Jul. 29, 1993 [JP] Japan .................. 5-205570

[51] Int. Cl.⁶ .................. H01L 21/20
[52] U.S. Cl. .................. 430/1; 430/2; 430/942; 359/1; 359/3; 250/306; 250/307; 250/311
[58] Field of Search .................. 430/1, 2, 290, 430/942; 359/1, 3; 250/306, 307, 311

[56] References Cited

U.S. PATENT DOCUMENTS 4,935,625  6/1990  Hasegawa et al. .................. 250/311
4,998,788  3/1991  Osakabe et al. .................. 359/1
5,298,747  3/1994  Ichikawa et al. .................. 250/311

FOREIGN PATENT DOCUMENTS

63-124513  5/1988  Japan .
1232715    9/1989  Japan .
5-47337    2/1993  Japan .................. 250/311

Primary Examiner—Charles L. Bowers, Jr.
Assistant Examiner—Martin J. Angebranndt
Attorney, Agent, or Firm—Sughrue, Mion, Zinn, Macpeak & Seas

[57] ABSTRACT

In a nanometer order dot pattern producing method and drawing apparatus by electron holography, a nanometer order dot pattern is readily produced with a high accuracy, using a pair of biprisms or multi-biprisms integrated as a unit so as to mutually cross. Each multi-biprism includes a plurality of biprisms arranged in parallel. Electric potentials of the integrated biprisms or multi-biprisms are independently controlled.

4 Claims, 7 Drawing Sheets

METHOD FOR PRODUCING NANOMETER ORDER DOT PATTERN BY ELECTRON HOLOGRAPHY AND DRAWING APPARATUS FOR THE SAME

BACKGROUND OF THE INVENTION

The present invention relates to a method for producing a nanometer order cyclic dot pattern using electron holographic interferometry for forming a ultra fine structure in the nanometer order device production and a drawing apparatus for producing the same.

DESCRIPTION OF THE RELATED ARTS

Figure 1:
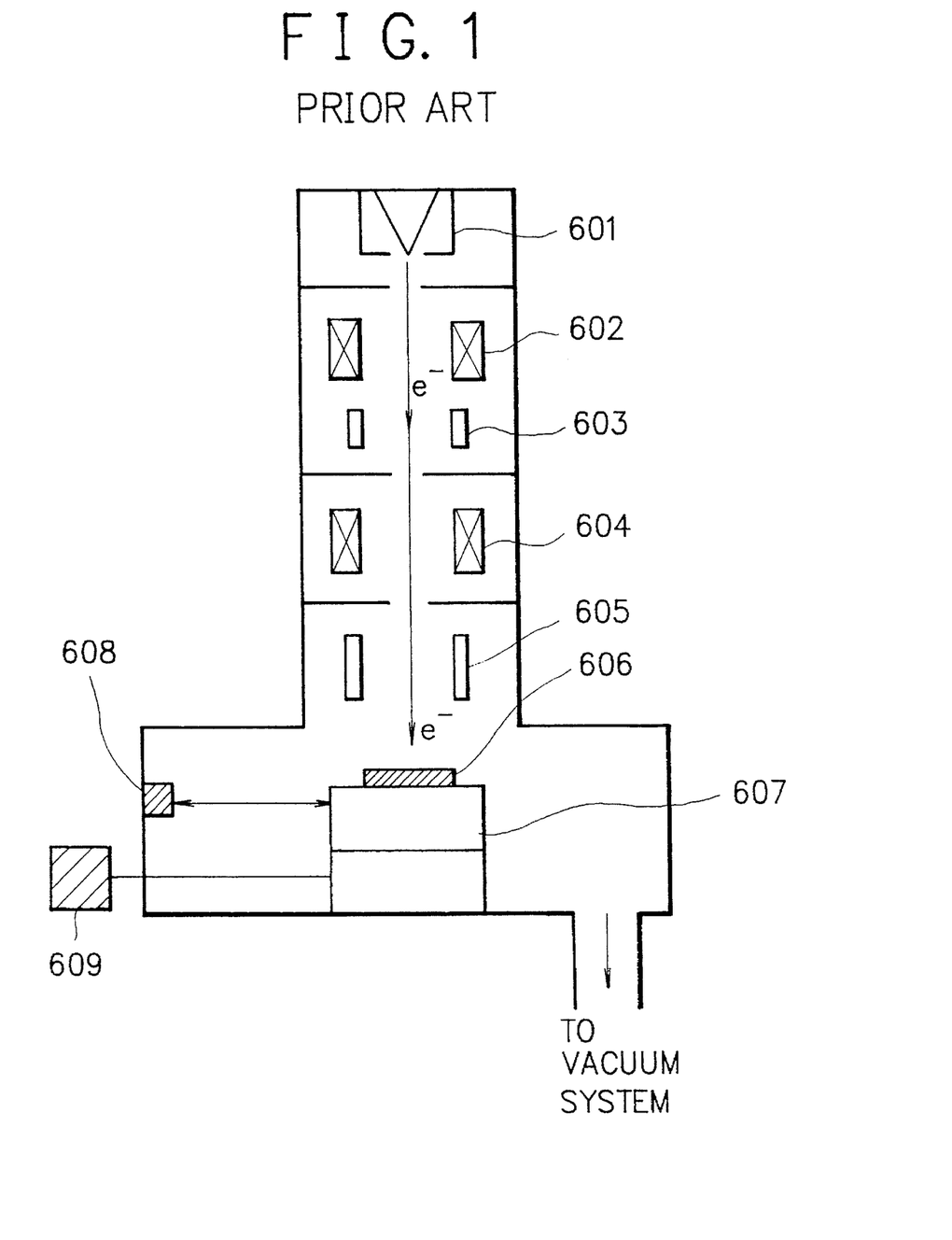
FIG. 1 is a schematic diagram of a conventional pattern drawing apparatus.

A conventional nanometer order pattern producing method, as in an apparatus shown in FIG. 1, has an electron beam within a beam diameter range of 5 to 10 nm projected from an electron gun 601 and deflected by a deflecting coil 605. The electron beam is irradiated onto an organic or inorganic resist formed on the substrate of a sample 606 to produce a nanometer order pattern on sample 606. The shown apparatus includes a first lens 602, a blanking 608, a second lens 604, a table 607 for supporting sample 606, a laser interferometer 608 and a step motor 609.

It is difficult for the conventional method to produce a cyclic dot pattern or grating having a pitch of 10 nm level with high accuracy due to a proximity effect.

Figure 2:
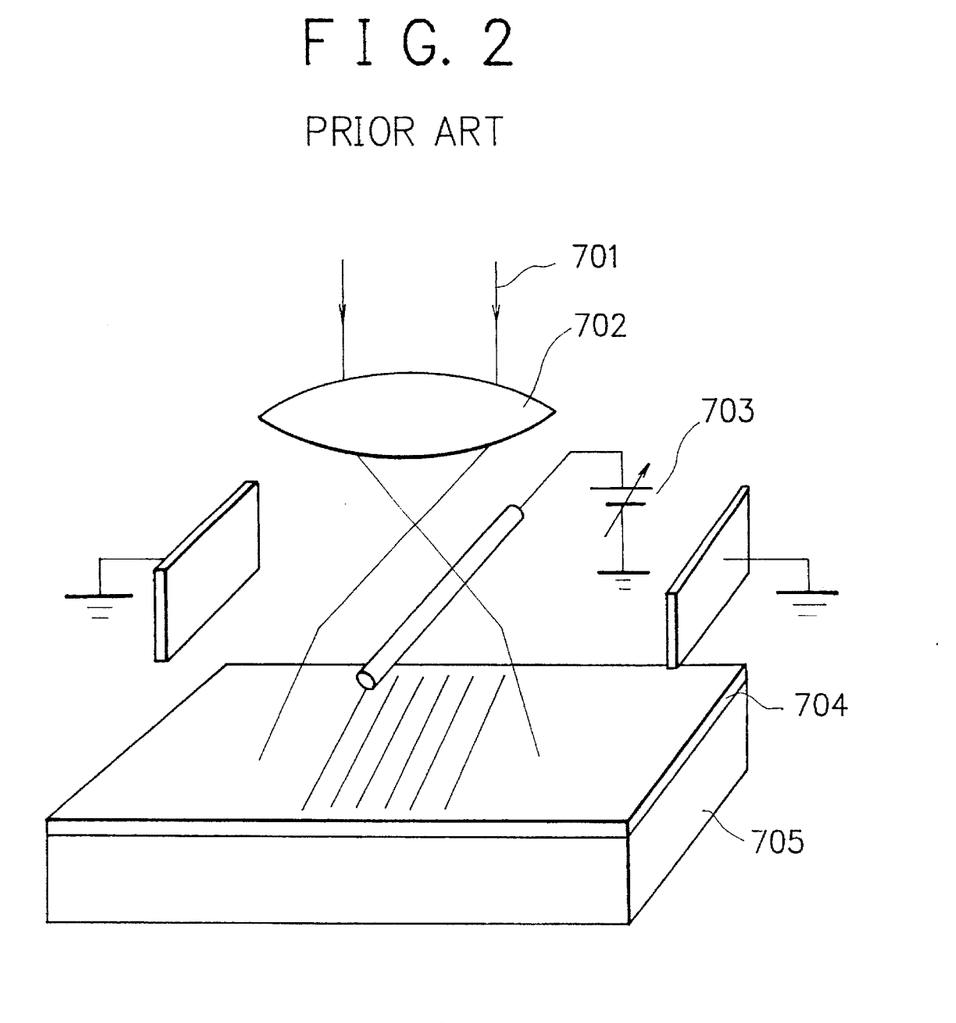
FIG. 2 is a schematic perspective view showing a conventional nanometer order ultra fine processing device using an electron holography.

A trial has been proposed to apply conventional electron holography techniques for observing physical properties, disclosed in Japanese Patent Laid-Open No. 63-124513 and Japanese Patent Laid-open No. 1-282715, to the production process of a nanometer order ultra fine structure. As shown in FIG. 2, the conventional techniques use an electron beam 701 projected from a field emission electron gun and divided into a pair of beams through a biprism 703. The divided beams interfere with each other so as to form a nanometer order grating on a resist 704. However, an electronsensitive material on a substrate 705 is exposed twice to the beams by rotating substrate 705 at a 90° position to form a dot pattern on the electron sensitive material. Such the rotation needs a very precise positioning, besides the two-staged exposure requiring a complicated process.

SUMMARY OF THE INVENTION

It is an object of the present invention to provide a method for producing a nanometer order dot pattern in view of the problems in the prior art, in a simplified manner with high precision.

It is another object of the present invention to provide a drawing apparatus for producing a nanometer order dot pattern, in a simplified manner with high precision.

One aspect of the present invention provides a method for producing a nanometer order dot pattern electron holography using an electron beam with high coherency, comprising steps of applying electric potentials to a pair of biprisms or multi-biprisms which are integrated as a unit so as to mutually cross, each multi-biprism including a plurality of biprisms arranged in parallel,and changing the potentials of the biprisms or multi-biprisms independently to produce a dot pattern on an electron sensitive material by the electron beam, with a controlled pattern pitch.

Another aspect of the present invention provides a nanometer order dot pattern drawing apparatus by electron holography, comprising: an electron beam irradiation system section including an electron beam source; a pair of multi-biprisms which are integrated as a unit so as to mutually cross, each multi-biprism including a plurality of biprisms arranged in parallel; a table for supporting a sample coated with an electron sensitive material; the electron beam irradiation system section, the multi-biprisms and the sample being arranged in order; a potential controller for independently controlling electric potentials of the multi-biprisms; a sample moving device for moving the sample; and a position controller for controlling the position of the sample.

Preferably, the nanometer order dot pattern drawing apparatus includes a gas introduction system for introducing a predetermined gas onto the sample.

According to the present invention, the dot pattern is produced using a pair of biprisms or multi-biprisms which are integrated as a unit so as to *mutually cross, each multi-biprism including a plurality of biprisms arranged in parallel, without the need of moving a substrate like in a conventional manner, but with high accuracy by a single exposure.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

Figure 3:
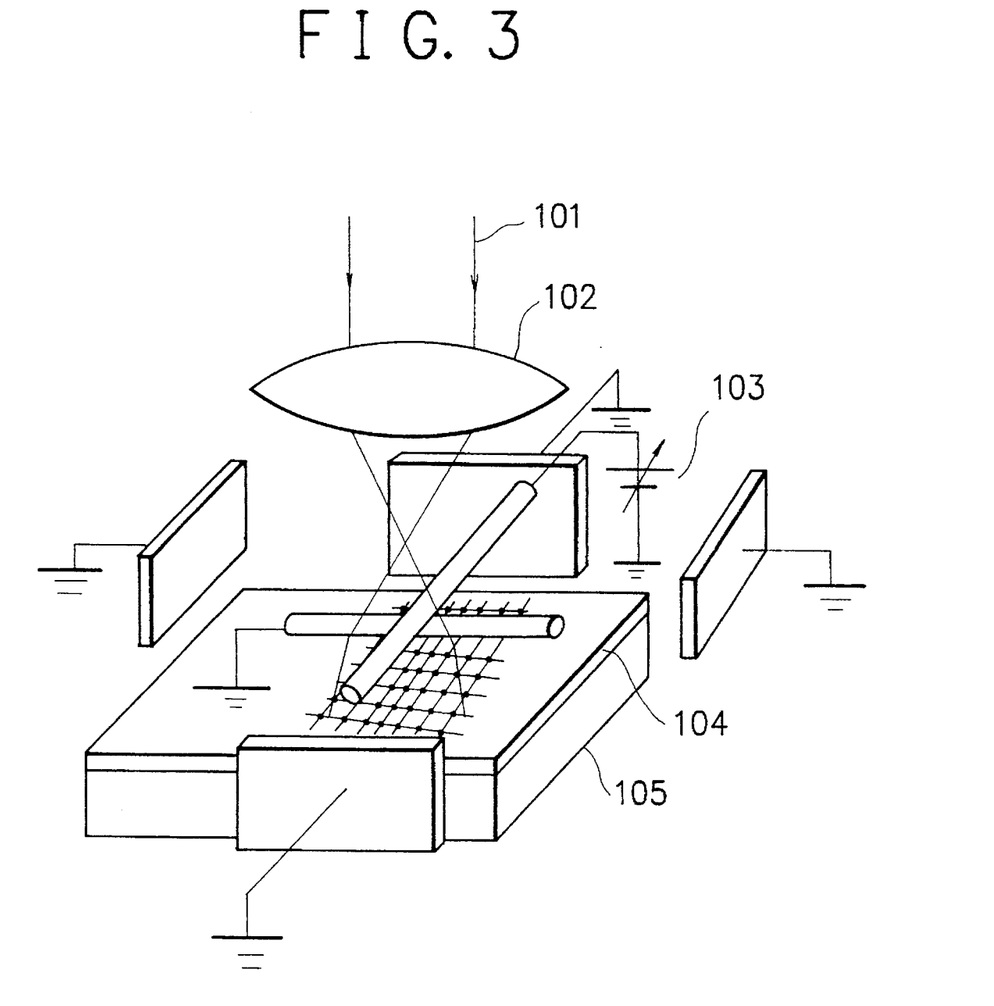
FIG. 3 is a schematic perspective view of a nanometer order ultra fine processing device using an electron holography for carrying out a nanometer order dot pattern producing method according to the present invention.

Referring now to the drawings, wherein like reference characters designate like or corresponding parts, shown in FIG. 3 is a nanometer order ultra fine processing device using an electron holography for carrying out a nanometer order dot pattern producing method according to the present invention.

In FIG. 3, an interference of electron interference patterns is effected, by a pair of biprisms 103 fixedly assembled or integrated as a unit so as to cross each other with right angles, on a resist of an electron sensitive material coated on a substrate 105 placed right under biprisms 103 to produce a dot interference pattern on resist 104.

Biprisms 103 give a dot pattern over a relatively small area.

Figure 4:
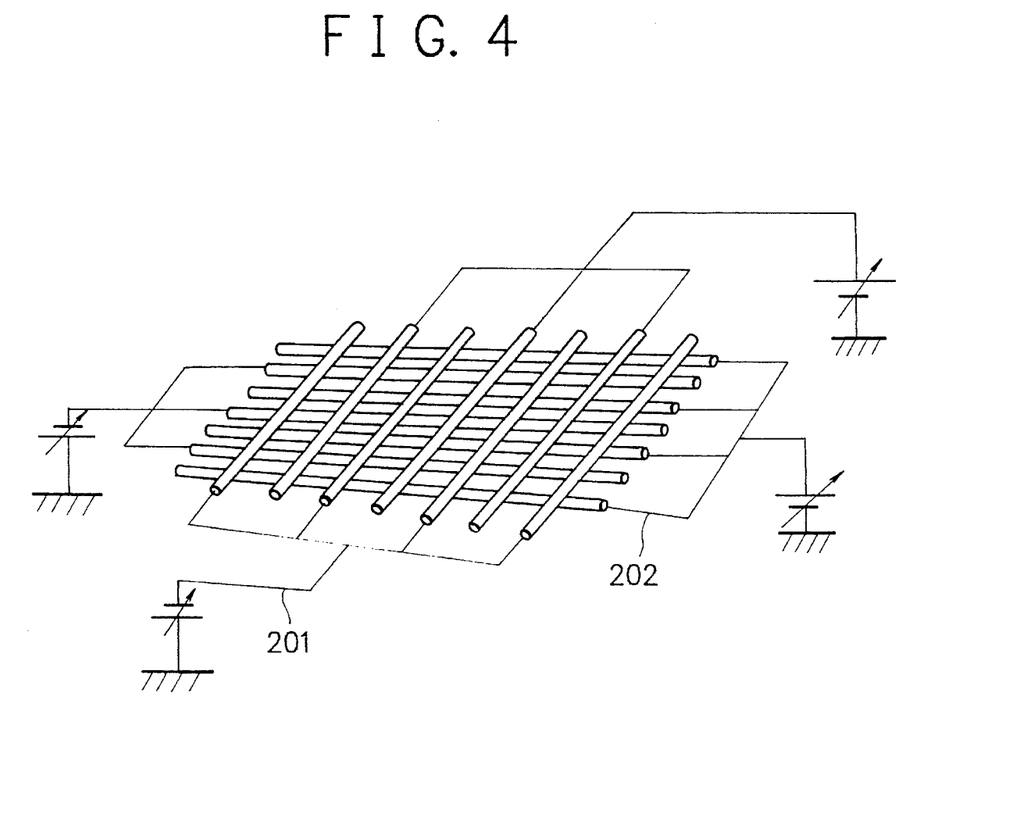
FIG. 4 is a schematic perspective view of multi-biprisms used in the device shown in FIG. 3.

In FIG. 4, to cover a relatively large area of dot pattern, there are employed a pair of multi-biprisms 201, 202 each respectively composed of two sets of biprism having a comb-like structure. Multi-biprisms 201,202 are fixedly assembled or integrated as a unit so as to cross each other with right angles.

Figure 5A:
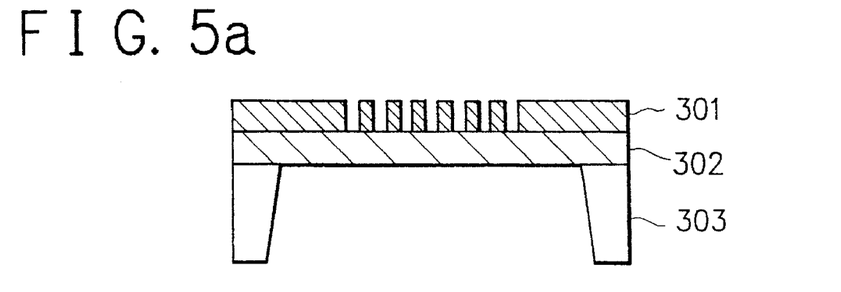
FIGS. 5a to 5e are schematic views showing a process for producing multi-biprisms used in an nanometer order dot pattern producing method according to the present invention.
Figure 5B:
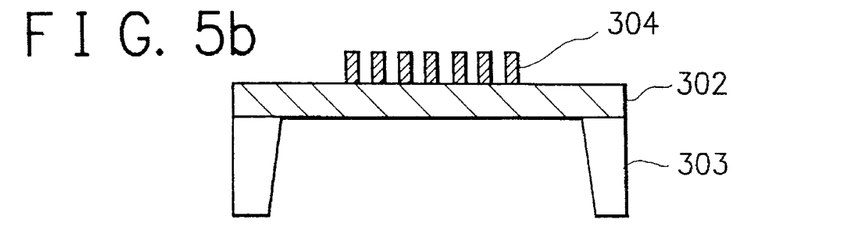

FIGS. 5a to 5e illustrate a process for producing multi-biprisms to be used for the production of a dot pattern. First, as shown in FIG. 5a, a resist 301 is applied on a silicon nitride membrane 302 as a window membrane structure of a substrate 303, and a plurality of comb-like projections as electrodes are formed together with corresponding comb-like slots in resist 301 by using electron beams. In FIG. 5b, a lower metal pattern 304 for lower multi-biprism is formed on silicon nitride membrane 302 by a lift-off process. The material of the metal pattern may be gold, aluminum or the like.

Figure 5C:
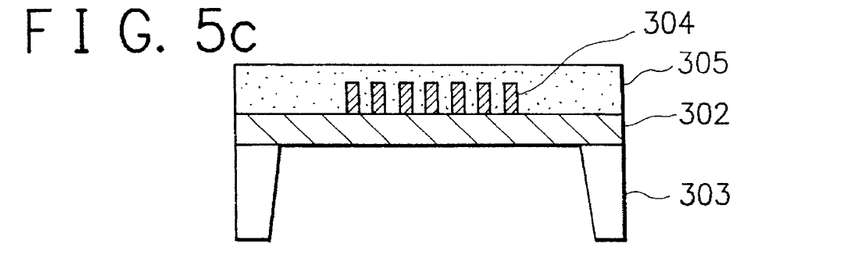

Next, for the insulation between upper and lower multi-biprisms, as shown in FIG. 5c, an interlayer insulating film 305 composed of $SiO_2$ or silicon nitride is formed on silicon nitride membrane 302, covering or sealing the entirety of lower metal pattern 304 by a CVD (chemical vapor deposition) method or the like.

Figure 5D:
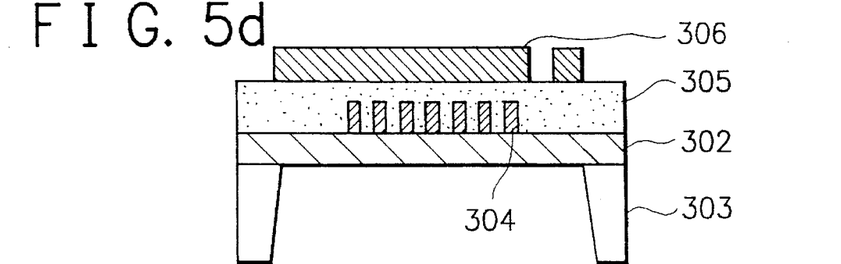

In FIG. 5d, an upper metal pattern 306 for upper multi-biprism is prepared on interlayer insulating film 305 in the same manner as lower metal pattern 304. The comb-like projections as electrodes of upper multi-biprism 306 are perpendicular to those of lower multi-biprism 304, as shown in FIG. 6.

In each multi-biprism, the projections of either set of biprism intervene or extend into corresponding slots of the other set.

Figure 5E:
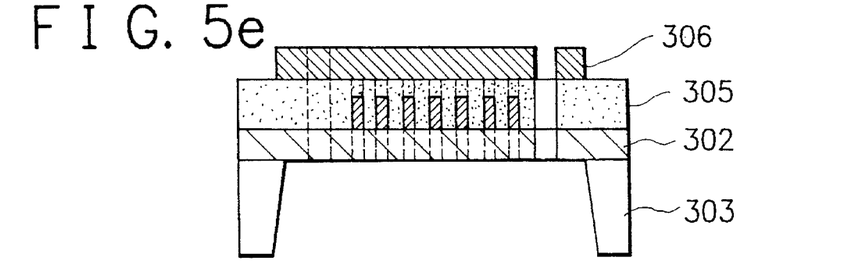

Finally, by using upper and lower metal patterns 306, 304 as etching masks for a dry etching, the silicon nitride membrane 302 as a substrate of the window and interlayer insulating film 305 are etched simultaneously to make an open window, as shown in FIG. 5e.

Figure 6:
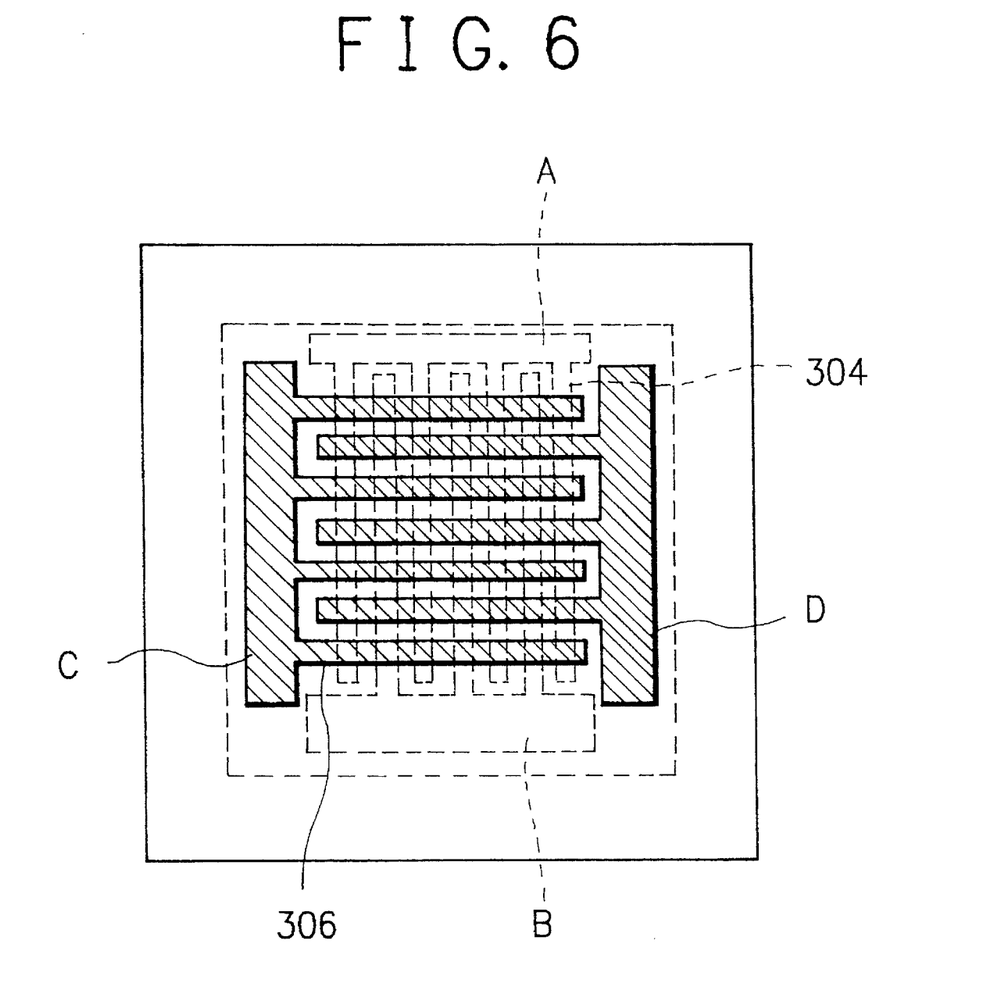
FIG. 6 is an elevational view of comb-like electrodes used in the process shown in FIGS. 5a to 5e.

In FIG. 6, positive and negative voltages are applied either to respective electrodes A and B of the lower multi-biprism and the other to respective electrodes C and D of the upper multi-biprism to produce a dot pattern over a relatively large area.

The voltages to the multi-biprisms are variable to control the pitch of electron interference pattern. Further, by independently controlling the voltages to the upper and lower multi-biprisms, the pattern pitch is changed in both vertical and horizontal directions.

Figure 7:
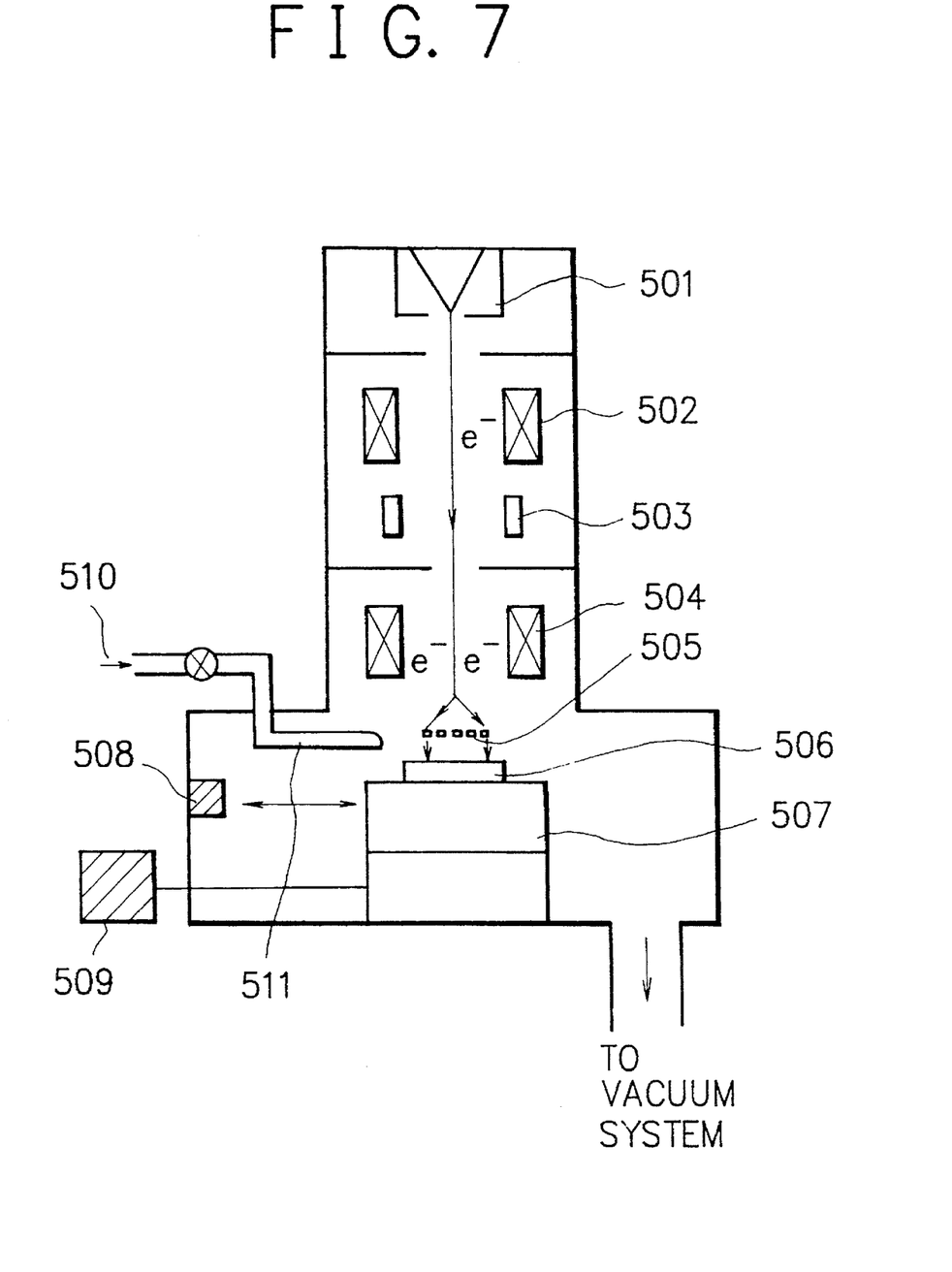
FIG. 7 is a schematic diagram of a pattern drawing apparatus according to the present invention.

FIG. 7 shows a dot pattern drawing apparatus using the multi-biprisms described above. The apparatus of FIG. 7 includes an electron irradiation system section having an electron source (electron gun) 501, a first lens 502, a blanking 503 and a second lens 504. Multi-biprisms 505 and a sample 506 on a table 507 are arranged in order from above and table 507 with sample 506 is moved by a step motor 509. A laser interferometer 508 precisely controls the position of sample 506. In this apparatus, in addition to the resist pattern formation, a deposition, an etching and a doping can be performed by introducing a source gas 510 via a gas supply nozzle 511. This apparatus is connected to a vacuum system.

As described above, according to the present invention, a nanometer order dot pattern can be produced with a high accuracy, by using a pair of mutually crossing integurated multi-biprisms needing a single exposure operation.

While the present invention has been described with reference to the particular illustrative embodiments, it is not restricted to those embodiments but only by the appended claims. It is to be appreciated that those skilled in the art can change or modify the embodiments without departing from the scope and spirit of the present invention.

What is claimed is:

1. A method for producing a nanometer order dot pattern by electron holography using an electron beam high of coherency, comprising the steps of:

applying electric potentials to a pair of multi-biprisms integrated as a unit so as to mutually cross, each multi-biprism including a plurality of biprisms arranged in parallel;

passing the electron beam through the multi-biprisms which divide the electron beam into at least four separate electron beams; and changing the potentials of the multi-biprisms independently to produce a dot pattern on an electron sensitive material from the four electron beams, with a controlled pattern pitch.

2. A method as claimed in claim 1, wherein:

each of said multi-biprisms is composed of two sets of biprisms having a comb-like structure;

said comb-like structure having a plurality of comb-like projections as electrodes and comb-like slots; and wherein said comb-like projections of either set extend into corresponding comb-like slots of the other.

3. A method as claimed in claim 1, wherein one of said pair of multi-biprisms forms an upper layer and the other forms a lower layer.

4. A method as claimed in claim 2, wherein:

a positive voltage is applied to either of the two sets of biprisms, and a negative voltage, to the other.

\* \* \* \* \*

UNITED STATES PATENT AND TRADEMARK OFFICE
CERTIFICATE OF CORRECTION

PATENT NO. : 5,466,548
DATED : November 14, 1995
INVENTOR(S) : Shinji MATSUI

It is certified that error appears in the above-indentified patent and that said Letters Patent is hereby corrected as shown below:

Col. 1, line 22, delete "608", insert --603--.

Signed and Sealed this

Twenty-eighth Day of May, 1996

Attest:

BRUCE LEHMAN

*Attesting Officer*     *Commissioner of Patents and Trademarks*